US009640275B1

(12) United States Patent
Nakajima et al.

(10) Patent No.: US 9,640,275 B1
(45) Date of Patent: May 2, 2017

(54) ONE-TIME MEMORY CONTROL APPARATUS

(71) Applicant: Mitsubishi Electric Corporation, Tokyo (JP)

(72) Inventors: Masahiro Nakajima, Tokyo (JP); Katsuyuki Sumimoto, Tokyo (JP); Junya Sasaki, Tokyo (JP); Akio Kamimurai, Tokyo (JP); Keisuke Katsurada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/265,987

(22) Filed: Sep. 15, 2016

(30) Foreign Application Priority Data

May 24, 2016 (JP) ................................. 2016-103047

(51) Int. Cl.
*G11C 17/00* (2006.01)
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ...... G11C 17/16; G11C 17/17; H01L 23/5252
USPC ........................................ 365/96, 225.7, 201
See application file for complete search history.

(56) References Cited

U.S. PATENT DOCUMENTS

| 7,791,972 | B2* | 9/2010 | Ouelette | G11C 17/165 365/225.7 |
| 8,482,997 | B2* | 7/2013 | Hanzawa | G01R 31/31715 365/201 |
| 8,817,560 | B2* | 8/2014 | Jung | G11C 29/785 365/200 |
| 9,087,610 | B2* | 7/2015 | Hwang | G11C 29/027 |
| 2007/0201259 | A1* | 8/2007 | Van Gorsel | G11C 17/18 365/96 |
| 2008/0089160 | A1 | 4/2008 | Dono et al. | |

FOREIGN PATENT DOCUMENTS

JP  2008-097696 A  4/2008
JP  2011-210316 A  10/2011

* cited by examiner

*Primary Examiner* — Connie Yoha
(74) *Attorney, Agent, or Firm* — Sughrue Mion, PLLC; Richard C. Turner

(57) ABSTRACT

A one-time memory control apparatus is obtained that prevents erroneous opening of a fuse from causing logic conversion and enhances the reliability. The one-time memory control apparatus includes an opening current creation fuse C opening switch and an opening current creation fuse D opening switch that each allow a fuse opening current from a fuse opening current creation circuit to flow in response to an opening enable signal, and a fuse opening permission signal creation circuit that receives respective logic signals corresponding to the states of fuse opening currents that flow through an opening current creation fuse C and an opening current creation fuse D, and that creates a fuse opening permission signal.

4 Claims, 5 Drawing Sheets

ONE-TIME MEMORY CONTROL APPARATUS

BACKGROUND OF THE INVENTION

Field of the Invention

The present invention relates to a one-time memory control apparatus suitable for a vehicle LSI (semiconductor integrated circuit) utilizing built-in fuses.

Description of the Related Art

As a means for writing and retaining inherent information items such as setting values at a time when an LSI is shipped, a one-time memory such as a fuse is utilized. The logic for the state of information to be retained in the one-time memory is determined by the closing state of the fuse. However, there has been a problem that due to thermal expansion, distortion caused by a stress, or the like, a fuse that has been opened is closed again and hence an accidental logic conversion occurs. Moreover, there has been a problem that a fuse that has not been opened is opened due to a disturbance such as noise and hence an accidental logic conversion occurs.

For example, in the state determination method for a semiconductor device and a fuse circuit disclosed in Patent Document 1, two or more fuses are multiplexed and a fuse logic is determined through a logical sum, so that contact between opened surfaces that have been opened at a time of opening of a fuse is prevented from causing an accidental logic conversion. In the semiconductor device disclosed in Patent Document 2, a fuse writing enable signal itself for controlling a fuse opening current is nullified, so that erroneous opening of a fuse at a time when the fuse is not to be opened is prevented from causing an accidental logic conversion.

[Patent Document 1] Japanese Patent Application Laid-Open No. 2011-210316

[Patent Document 2] Japanese Patent Application Laid-Open No. 2008-97696

However, in the case of Patent Document 1, there has been a problem that although in the case where a fuse that has been opened is closed, an accidental logic conversion can be prevented through multiplexing, a fuse cannot be prevented from being opened by a fuse opening current that erroneously flows. Moreover, in the case of Patent Document 2, there has been a problem that although there is provided a fuse for prohibiting the operation of a fuse opening current creation circuit, the reliability is low because multiplexing of a fuse is not implemented.

SUMMARY OF THE INVENTION

The present invention has been implemented in order to solve the foregoing problems; the objective thereof is to provide a one-time memory control apparatus that prevents a fuse from being erroneously opened and can prevent logic conversion from being caused due to accidental opening of a fuse.

A one-time memory control apparatus according to the present invention includes a fuse opening current creation circuit that creates a fuse opening current in response to a fuse opening permission signal, a first information fuse opening switch that is connected with a first information fuse and allows a fuse opening current from the fuse opening current creation circuit to flow in response to an opening enable signal, a second information fuse opening switch that is connected with a second information fuse and allows a fuse opening current from the fuse opening current creation circuit to flow in response to an opening enable signal, a first opening current creation fuse opening switch that is connected with a first opening current creation fuse and allows a fuse opening current from the fuse opening current creation circuit to flow in response to an opening enable signal, a second opening current creation fuse opening switch that is connected with a second opening current creation fuse and allows a fuse opening current from the fuse opening current creation circuit to flow in response to an opening enable signal, a logic unit to which respective logic signals corresponding to the states of fuse opening currents that flow through the first information fuse, the second information fuse, the first opening current creation fuse, and the second opening current creation fuse are inputted, and a fuse opening permission signal creation circuit that is provided in the logic unit, that receives respective logic signals corresponding to the states of fuse opening currents that flow through the first opening current creation fuse and the second opening current creation fuse, and that creates a fuse opening permission signal.

In the present invention, because a fuse for prohibiting the operation of the fuse opening current creation circuit is multiplexed, the fuse is prevented from being erroneously opened and hence accidental opening of the fuse is prevented from converting a logic; therefore, the reliability can be enhanced.

The foregoing and other object, features, aspects, and advantages of the present invention will become more apparent from the following detailed description of the present invention when taken in conjunction with the accompanying drawings.

DETAILED DESCRIPTION OF THE PREFERRED EMBODIMENTS

Embodiment 1

Embodiment 1 of the present invention will be explained below with reference to FIG. 1.

Figure 1:
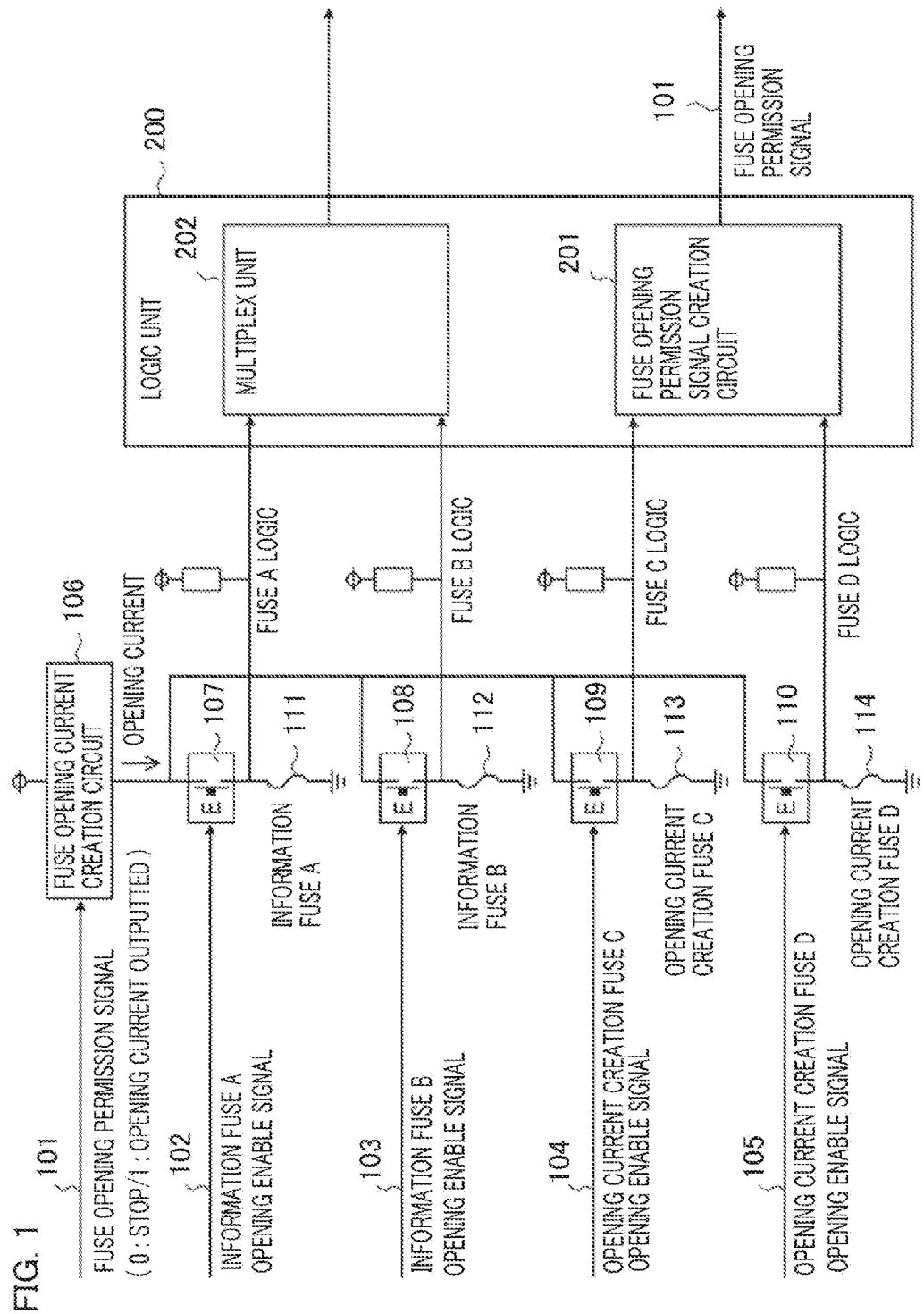
FIG. 1 is a block diagram representing a one-time memory control apparatus according to Embodiment 1 of the present invention.

FIG. 1 is a block diagram representing a one-time memory control apparatus according to Embodiment 1. The one-time memory control apparatus according to the present invention is configured with a group of information fuses for writing and retaining inherent information items such as setting values at a time when a product of LSI (semiconductor integrated circuit) is shipped, a fuse opening current creation circuit for opening these information fuses, an information fuse opening enable signal for selecting a fuse to be opened among the group of information fuses, an opening current creation fuse for prohibiting the operation of the fuse opening current creation circuit in order to prevent an information fuse from being erroneously opened after shipping of the product, and a multiplex determination circuit, formed of two or more fuses, for preventing an opening current creation fuse, which has been opened, from being erroneously closed due to thermal expansion or the like.

Specifically, there are provided
  a fuse opening current creation circuit 106 that creates a fuse opening current in response to a fuse opening permission signal 101,
  an information fuse A opening switch 107, which is a first information fuse opening switch that is connected with an information fuse A 111, which is a first information fuse, and that allows a fuse opening current from the fuse opening current creation circuit 106 to flow in response to an opening enable signal 102 for the information fuse A 111, and
  an information fuse B opening switch 108, which is a second information fuse opening switch that is connected with an information fuse B 112, which is a second information fuse, and that allows a fuse opening current from the fuse opening current creation circuit 106 to flow in response to an opening enable signal 103 for the information fuse B 112.

Moreover, there are provided
  an opening current creation fuse C opening switch 109, which is a first opening current creation fuse opening switch that is connected with an opening current creation fuse C 113, which is a first opening current creation fuse, and that allows a fuse opening current from the fuse opening current creation circuit 106 to flow in response to an opening enable signal 104 for the opening current creation fuse C 113, and
  an opening current creation fuse D opening switch 110, which is a second opening current creation fuse opening switch that is connected with an opening current creation fuse D 114, which is a second opening current creation fuse, and that allows a fuse opening current from the fuse opening current creation circuit 106 to flow in response to an opening enable signal 105 for the opening current creation fuse D 114.

Furthermore, there is provided a logic unit 200 to which respective logic signals corresponding to the states of fuse opening currents that flow through the first information fuse A 111, the second information fuse B 112, the first opening current creation fuse C 113, and the second opening current creation fuse D 114 are inputted. The logic unit 200 has a fuse opening permission signal creation circuit 201 that receives respective logic signals corresponding to the states of fuse opening currents that flow through the first opening current creation fuse C 113 and the second opening current creation fuse D 114 and creates the fuse opening permission signal 101 and a multiplex unit (refer to also as a first multiplex unit) 202 that receives respective logic signals corresponding to the states of fuse opening currents that flow through the first information fuse A 111 and the second information fuse B 112.

Figure 2:
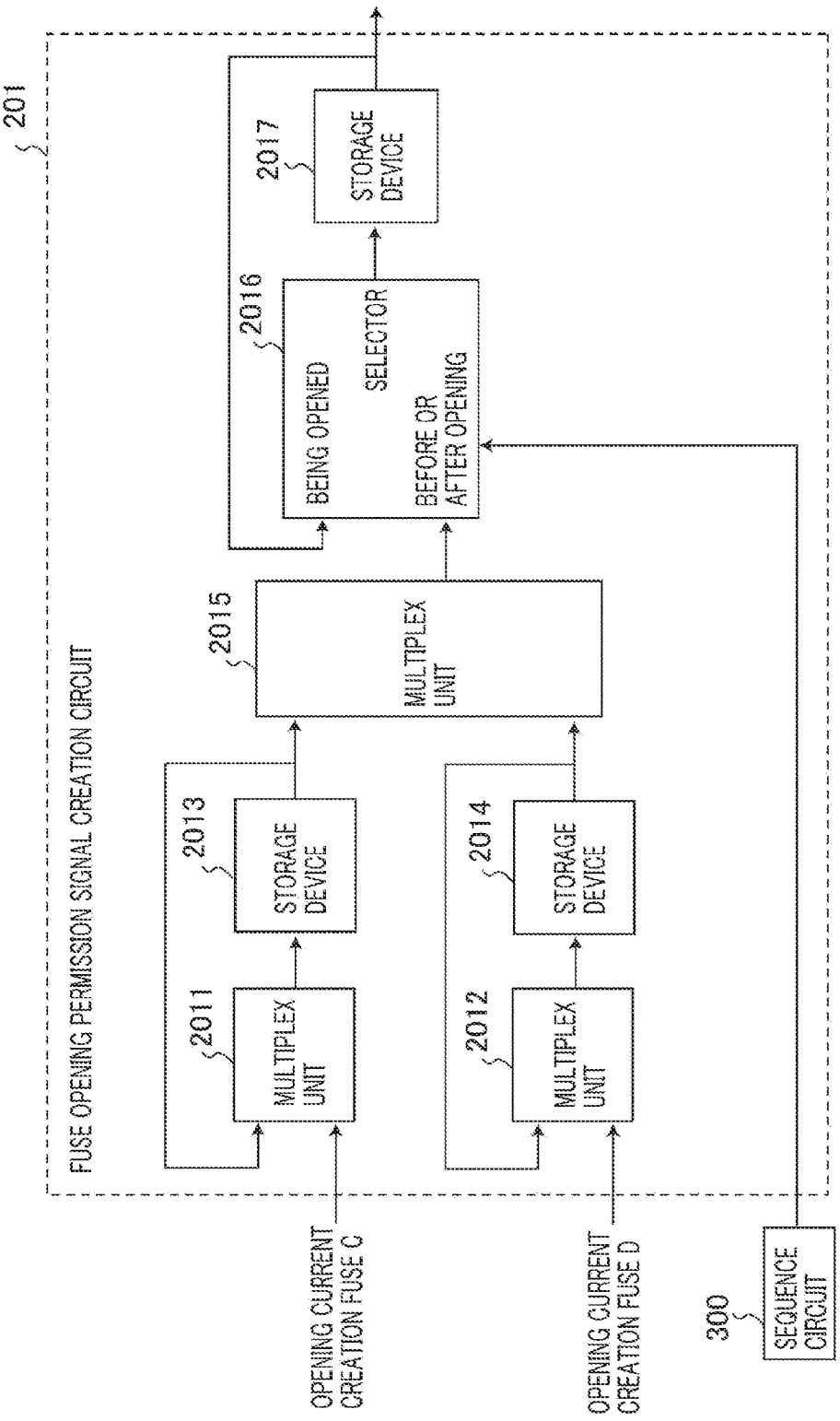
FIG. 2 is a block diagram representing a fuse opening permission signal creation circuit in the one-time memory control apparatus according to Embodiment 1 of the present invention.

FIG. 2 is a block diagram representing an example of specific configuration of the fuse opening permission signal creation circuit 201.

As represented in FIG. 2, the fuse opening permission signal creation circuit 201 includes
  a multiplex unit (refer to also as a second multiplex unit) 2011 that receives a logic signal for the opening current creation fuse C,
  a multiplex unit (refer to also as a third multiplex unit) 2012 that receives a logic signal for the opening current creation fuse D,
  a storage device (refer to also as a first storage device) 2013 that receives a signal from the multiplex unit 2011,
  a storage device (refer to also as a second storage device) 2014 that receives a signal from the multiplex unit 2012,
  a multiplex unit (refer to also as a fourth multiplex unit) 2015 that receives respective signals from the storage device 2013 and the storage device 2014,
  a selector 2016 that receives a signal from the multiplex unit 2015 and a signal, from a sequence circuit 300, that is utilized as information from the outside—these signals, as information items indicating whether or not the corresponding fuse has been opened, are inputted to the selector 2016, and
  a storage device (refer to also as a third storage device) 2017 that receives a signal from the selector 2016.

The signal from the storage device 2013 is inputted to the multiplex unit 2011; the signal from the storage device 2014 is inputted to the multiplex unit 2012. Moreover, a signal from the storage device 2017, as information indicating that the corresponding fuse is being opened, is inputted to the selector 2016.

Next, the operation of the foregoing one-time memory control apparatus will be explained.

FIG. 1 is a diagram representing an example of configuration of the one-time memory control apparatus according to Embodiment 1.

When inherent information items such as setting values at a time of product shipping have not been written, all fuses are closed.

When information is written, the fuse opening permission signal creation circuit 201 is activated by some sort of means from the outside, so that the fuse opening permission signal 101 is enabled and hence the fuse opening current creation circuit 106 outputs an opening current.

When only the information fuse A opening enable signal 102 is enabled by some sort of means from the outside, the information fuse A opening switch 107 is turned on and hence the information fuse A 111 is opened. In Embodiment 1, only the information fuse A 111 is opened.

After the information fuse is opened, only the opening current creation fuse C opening enable signal 104 is enabled, so that the opening current creation fuse C opening switch 109 is turned on and hence the opening current creation fuse C 113 is opened.

Then, only the opening current creation fuse D opening enable signal 105 is enabled, so that the opening current creation fuse D opening switch 110 is turned on and hence the opening current creation fuse D 114 is opened.

Because both the opening current creation fuse C 113 and the opening current creation fuse D 114 are opened, the opening permission signal creation circuit 201 disables the fuse opening permission signal 101 from being outputted; after that, the fuse opening permission signal 101 is not enabled.

Each of the information fuse A 111 and the information fuse B 112 is to write and retain inherent information items such as setting values at a time when the product of a semiconductor integrated circuit is shipped; each of the opening current creation fuse C 113 and the opening current creation fuse D 114 is to prohibit the operation of the fuse opening current creation circuit 106 in order to prevent the information fuse A 111 and the information fuse B 112 from being erroneously opened after the product of an semiconductor integrated circuit is shipped.

As described above, multiplexing is realized by the two fuses, i.e., the opening current creation fuse C 113 and the opening current creation fuse D 114; thus, even when any one of these fuses is erroneously closed due to thermal expansion of the like, the state of fuse is regarded as being opened as long as the other fuse is opened and hence the fuse opening permission signal 101 is not enabled; therefore, because the fuse opening current creation circuit 106 does not become effective, an unopened fuse is prevented from being erroneously opened.

FIG. 2 is a block diagram representing a specific example of the fuse opening permission signal creation circuit 201; the fuse opening permission signal creation circuit 201 has a function of keeping the determination circuit and the determination result from changing. The fuse opening permission signal creation circuit 201 receives from the sequence circuit 300 a signal for determining the opening state of a fuse and receives also a logic of opening/non-opening from each of the opening current creation fuse C 113 and the opening current creation fuse D 114. The storage devices 2013 stores the immediately previous value and the logic of the opening current creation fuse C 113 in a multiplexing manner and the storage devices 2014 stores the immediately previous value and the logic of the opening current creation fuse D 114 in a multiplexing manner; when the fuse has not been opened, the results of multiplexing in the storage devices 2013 and 2014 are outputted from the storage device 2017.

When the fuse is being opened, the value in the storage device 2017 is constantly outputted, so that the fuse opening current creation circuit 106 continues to supply an electric current to the fuse until both the opening current creation fuse C 113 and the opening current creation fuse D 114 are opened. After the fuse has been opened, the logics received from the opening current creation fuse C 113 and the opening current creation fuse D 114 are cut off, so that even when the information fuse opening enable signal is outputted, a fuse is not erroneously opened, because supply of the electric current from the fuse opening current creation circuit 106 has been cut off.

Moreover, in order to prevent the operation of the fuse opening current creation circuit 106 from being stopped at the instant when any one of the opening current creation fuse C 113 and the opening current creation fuse D 114 that are multiplexed is opened, there is provided a function of keeping and preventing the state in which the fuse opening permission signal creation circuit 201 enables the output of the fuse opening permission signal 101 from being changed, during the procedure of fuse-opening processing.

In Embodiment 1, the creation logic of the fuse opening permission signal creation circuit 201 has been explained with a dual system configured with the opening current creation fuses C and D; however, regardless of the dual system, it is made possible to implement it through an arbitrary multiplex system.

Embodiment 2

Hereinafter, Embodiment 2 of the present invention will be explained with reference to FIG. 3.

Figure 3:
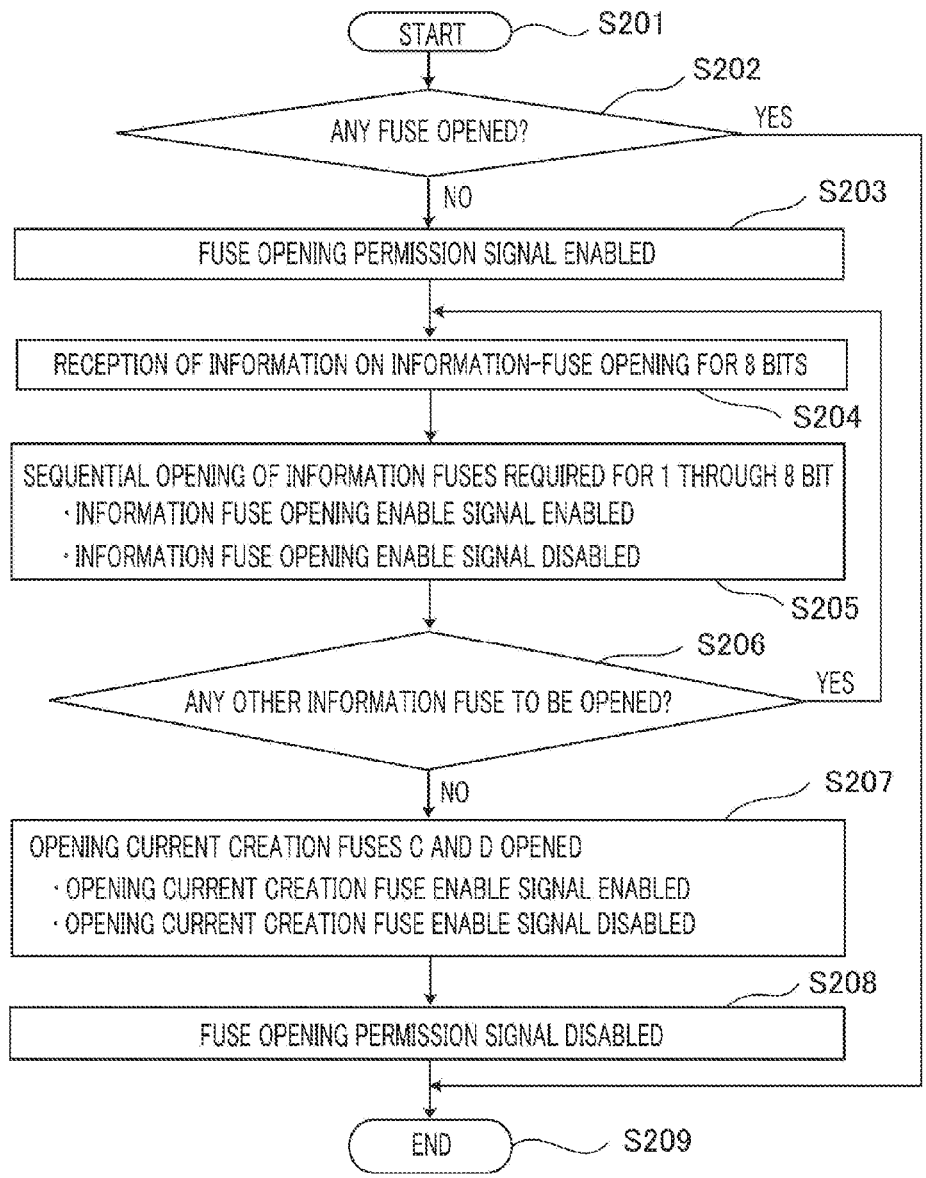
FIG. 3 is a sequence diagram representing a control sequence in a one-time memory control apparatus according to Embodiment 2.

FIG. 3 is a sequence diagram representing the processing by a one-time memory control apparatus according to Embodiment 2. The configuration of the control apparatus is the same as that in Embodiment 1. In the case where fuse-opening processing is performed from the outside of an LSI, the one-time memory control apparatus operates in accordance with this sequence.

In the step S201, the processing sequence is started; at first, in the step S202, it is ascertained whether or not there exists an opening current creation fuse that has already been opened. In general, when opening processing is started, the opening current creation fuse has already been closed; thus, because it is suggested that when the fuse has already been opened, the opening sequence is erroneously starting due to some sort of contributing factor, the result of the determination in the step S202 becomes "YES" and hence the step S202 is followed by the step S209, where the sequence is ended.

In the case where no fuse has been opened, the step S202 is followed by the step S203. In the step S203, the fuse opening permission signal is enabled; then, regardless of the state of each of the opening current creation fuses C and D, the state of being enabled is continued until the step S208 starts. Next, the step S203 is followed by the step S204. In the step S204, information-fuse opening information for 8 bits is received from the outside. In this situation, in the steps S201 through S204, the fuses have not been opened; thus, the result of multiplexing by the storage devices 2013 and 2014 in FIG. 2 is outputted by the storage device 2017. Next, the step S204 is followed by the step S205.

In the step S205, based on the information-fuse opening information for 8 bits, the next processing is implemented bit by bit. The information fuse opening enable signal for opening a fuse is enabled so as to open the fuse; after that, the information fuse opening enable signal, which has been enabled, is disabled. After the processing for 8 bits is ended, the step S205 is followed by the step S206.

In the step S206, it is ascertained whether or not there exists any other information fuse to be opened. In the case where there exists any other information fuse to be opened, the step S204 is resumed and the processing is repeated. In the case where there exists no other information fuse to be opened, the step S206 is followed by the step S207.

In this sequence, the fuses are being opened in the steps S205 through S207; the value of the storage device 2017 in FIG. 2 is constantly outputted, so that the fuse opening current creation circuit 106 continues to supply an electric current to the fuse until both the opening current creation fuse C and the opening current creation fuse D are opened.

In the step 207, the following processing is applied to each of the opening current creation fuses C and D.

The opening current creation fuse opening enable signal for opening a fuse is enabled so as to open the fuse; after that, the opening current creation fuse opening enable signal, which has been enabled, is disabled again. After the processing for 2 bits is ended, the step S207 is followed by the step S208.

In the step S208, the fuse opening permission signal is disabled. Next, the step S208 is followed by the step 209, where the sequence of fuse-opening processing is ended. In this sequence, the fuse has been opened in the steps S208 through S209; the logics received from the opening current creation fuse C 113 and the opening current creation fuse D 114 are cut off, so that even when the information fuse opening enable signal is outputted, a fuse is not erroneously opened, because supply of the electric current from the fuse opening current creation circuit 106 has been cut off.

In Embodiment 2, the information on the information fuse has been explained on a basis of 8 bits; however, regardless of the 8-bit system, it is made possible to realize the information on the information fuse through an arbitrary-bit system.

The one-time memory control apparatus according to each of Embodiments 1 and 2 is suitably mounted in a vehicle power generator control apparatus.

Figure 4:
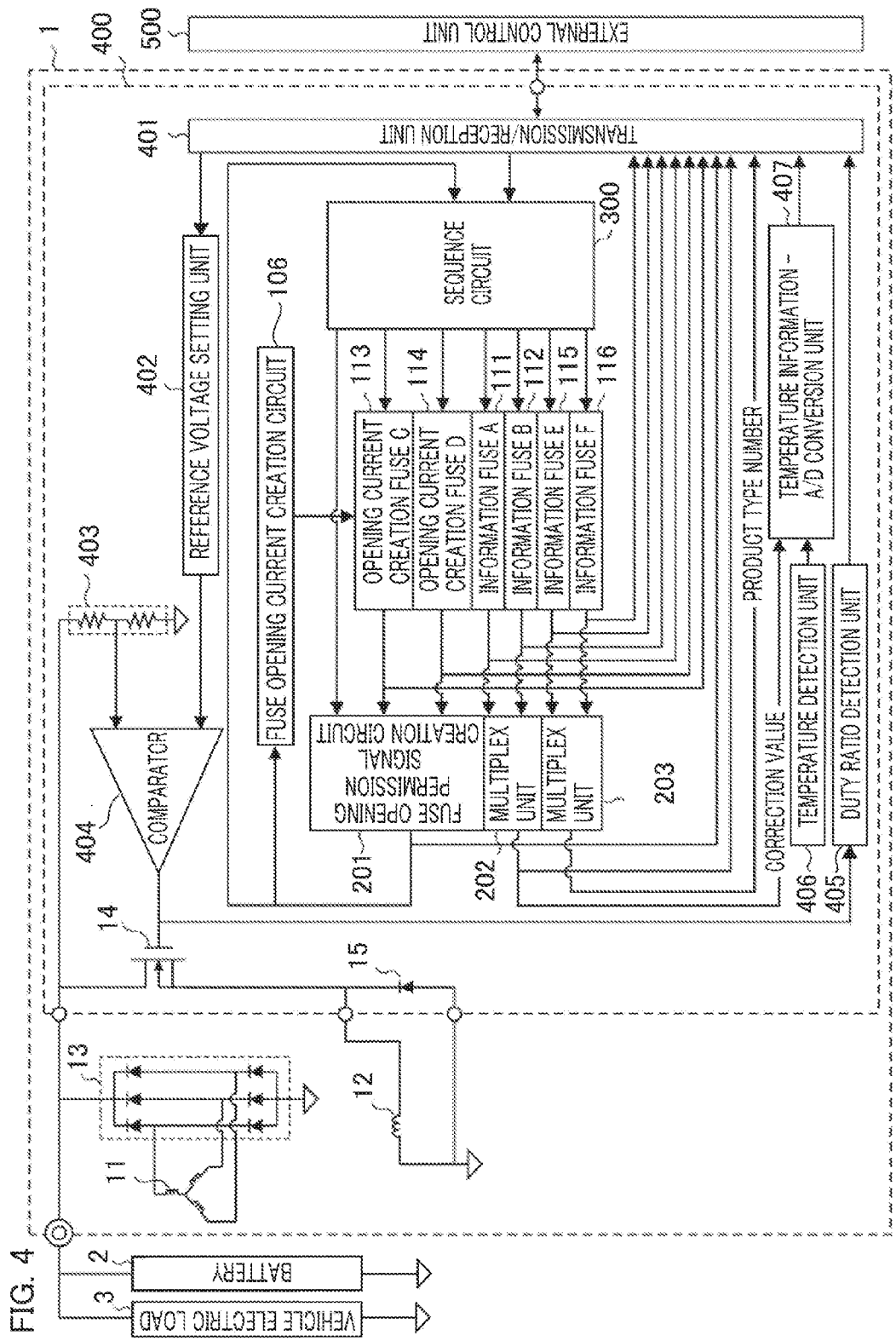
FIG. 4 is a block diagram representing an example at a time when the one-time memory control apparatus according to Embodiment 1 of the present invention is applied to a power-generation control apparatus.
Figure 5:
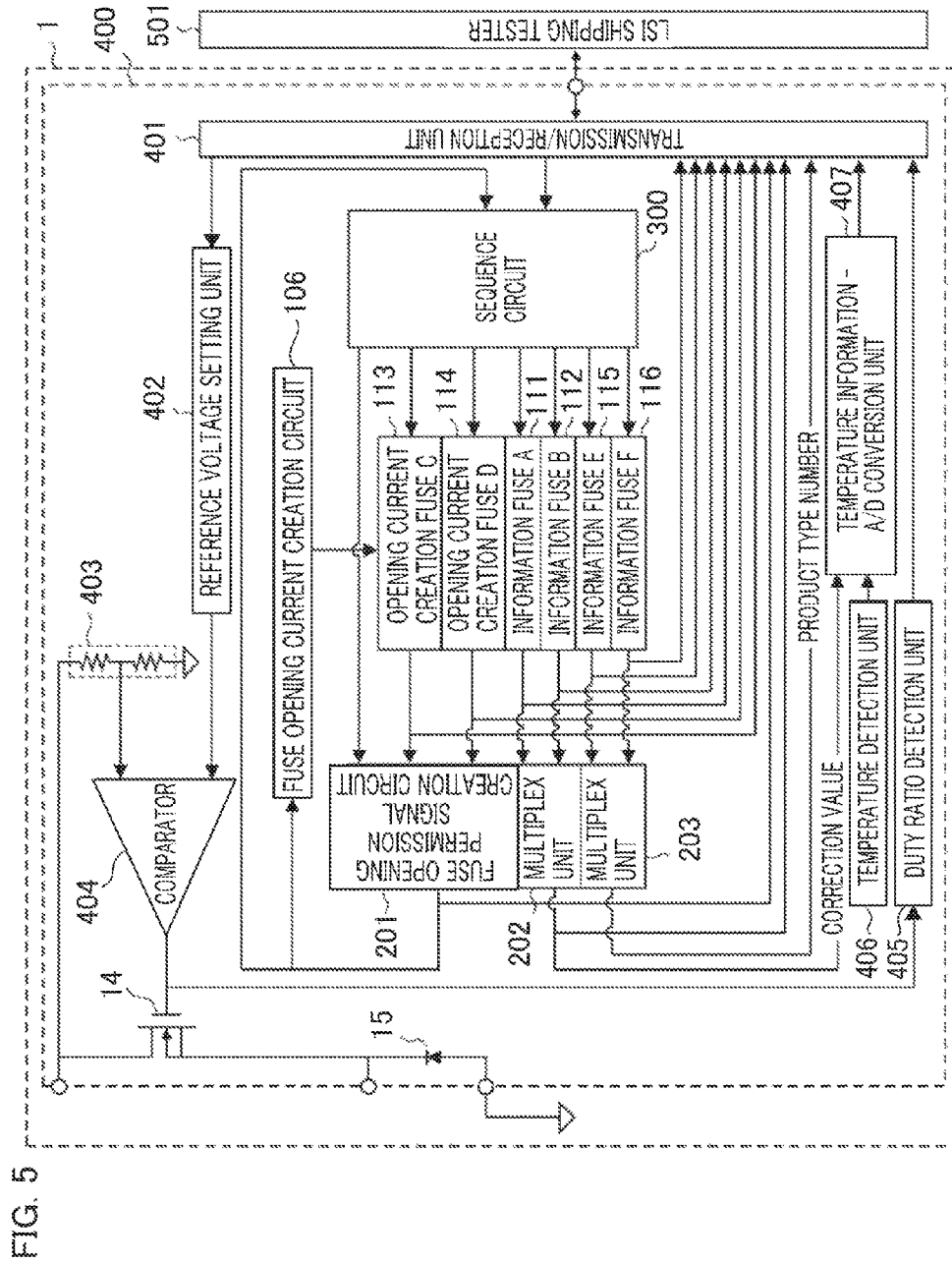
FIG. 5 is a block diagram for explaining fuse opening operation in the example to which the present invention is applied.

Each of FIGS. 4 and 5 represents an example in which the one-time memory control apparatus is applied to a power-generation control apparatus for a vehicle power generator. In addition, in FIGS. 4 and 5, the same reference characters as those in FIGS. 1 and 2 denote the same or equivalent elements.

At first, the configuration of a power-generation control apparatus and the power-generation operation will be explained with reference to FIG. 4.

In FIG. 4, an electric power generator 1 mounted in a vehicle includes a stator coil 11, a field coil 12 rotation-driven by an internal combustion engine (unillustrated), a three-phase full wave rectifier 13, and a power-generation control apparatus 400.

the output end of the three-phase full wave rectifier 13 is connected with the positive terminal of a battery 2 mounted in the vehicle, a vehicle electric load 3, which is an electric load mounted in the vehicle, and a power-generation control apparatus 400. The field coil 12 is connected with the power-generation control apparatus 400.

The power-generation control apparatus 400 has an excitation driver 14 for supplying and cutting off an electric current to the field coil 12. By PWM (Pulse Width Modulation)-controlling the excitation driver 14, the amount of the electric current to the field coil 12 is adjusted.

Moreover, the power-generation control apparatus 400 has a circulation diode 15 for the purpose of suppressing a surge produced by a change, in an electric current, that is caused by cutting off the electric current.

The power-generation control apparatus 400 incorporated in the electric power generator 1 PWM-controls the excitation driver 14 so as to adjust the amount of an electric current to the field coil 12.

Control data determined by the external control unit 500 is transmitted to the transmission/reception unit 401. The data received by the transmission/reception unit 401 is transmitted to the sequence circuit 300 and the reference voltage setting unit 402.

Based on the received data, the reference voltage setting unit 402 sets a reference voltage for performing control. The comparator 404 compares the reference voltage set by the reference voltage setting unit 402 with a voltage (input voltage) obtained by being detected by a voltage detection unit 403 that resistance-divides the output-terminal voltage of the electric power generator 1; in the case where the input voltage is lower than the reference voltage, the on-duty ratio of the PWM signal to the excitation driver 14 is increased so that the electric current to the field coil 12 is increased and hence the power-generation voltage of the electric power generator is increased.

In contrast, in the case where the input voltage is higher than the internal reference voltage, the on-duty ratio of the PWM signal to the excitation driver 14 is lowered so that the electric current to the field coil 12 is decreased and hence the power-generation voltage of the electric power generator is lowered.

Each of multiplex units 202 and 203 in FIGS. 4 and 5 is a block that multiplexes the logics of information fuses and then outputs the result. In each of FIGS. 4 and 5, a decision by majority is performed by use of two signals; however, the decision by majority may be performed by use of three or more signals.

A duty ratio detection unit 405 is a block that measures the on-time and the off-time in the on/off logic of a transistor included in the excitation driver 14 and then calculates the duty ratio (the proportion of the on-time or the conduction rate); a temperature detection unit 406 is a block that conversion temperature information into an electric signal by use of a temperature sensor; a temperature information—A/D conversion unit 407 is a block that converts the electric signal having a correlation with a temperature, outputted by the temperature detection unit 406, into a digital signal; then, the temperature information—A/D conversion unit 407 corrects the offset and the gradient of the temperature sensor by use of an input-signal "correction value" for correcting the manufacturing variation in the temperature sensors and then outputs the corrected digital signal.

The fuse opening permission signal creation circuit 201 is a block that creates a signal for turning on or off the function of the fuse opening current creation circuit 106 for supplying an electric current to a fuse and a signal for notifying the sequence circuit 300, which performs opening of the fuse, of the determination on whether or not the fuse can be opened.

Next, fuse opening operation will be explained. FIG. 5 is a block diagram for explaining the fuse opening operation.

In the case where a fuse is opened, an LSI shipping tester 501 transmits a communication command (e.g., LIN communication) to the transmission/reception unit 401. The command to be transmitted includes address information for specifying a fuse to be opened and opening/non-opening information for the specified fuse. The address information deals with fuses for two or more bits as a group; the fuse opening/non-opening information notifies each of the specified fuses for two or more bits of whether or not to be opened.

The sequence circuit 300 opens the information fuse and the opening current creation fuse specified by the LSI shipping tester 501. A command is transmitted to the power-generation control apparatus 400, through a LIN frame, for example, and the fuse thereof can be opened.

In the case where the opening current creation fuse C 113 or the opening current creation fuse D 114 is being opened, the sequence circuit 300 notifies the fuse opening permission signal creation circuit 201 of the fact. When both the opening current creation fuse C 113 and the opening current creation fuse D 114 are being opened, the opening current creation fuse C 113 or the opening current creation fuse D 114 is not multiplexed; then, after the opening is completed, the fuse opening permission signal for each of the sequence circuit 300 and the fuse opening current creation circuit 106 is disabled so that writing is prohibited thereafter.

Various modifications and alterations of this invention will be apparent to those skilled in the art without departing from the scope and spirit of this invention, and it should be understood that this is not limited to the illustrative embodiments set forth herein.

What is claimed is:

1. A one-time memory control apparatus for a one-time memory that retains information by use of a fuse, comprising:
  a fuse opening current creation circuit that creates a fuse opening current in response to a fuse opening permission signal;
  a first information fuse opening switch that is connected with a first information fuse and allows a fuse opening current from the fuse opening current creation circuit to flow in response to an opening enable signal;
a second information fuse opening switch that is connected with a second information fuse and allows a fuse opening current from the fuse opening current creation circuit to flow in response to an opening enable signal;
a first opening current creation fuse opening switch that is connected with a first opening current creation fuse and allows a fuse opening current from the fuse opening current creation circuit to flow in response to an opening enable signal;
a second opening current creation fuse opening switch that is connected with a second opening current creation fuse and allows a fuse opening current from the fuse opening current creation circuit to flow in response to an opening enable signal;
a logic circuit to which respective logic signals corresponding to the states of fuse opening currents that flow through the first information fuse, the second information fuse, the first opening current creation fuse, and the second opening current creation fuse are inputted; and
a fuse opening permission signal creation circuit that is provided in the logic circuit, that receives respective logic signals corresponding to the states of fuse opening currents that flow through the first opening current creation fuse and the second opening current creation fuse, and that creates the fuse opening permission signal.

2. The one-time memory control apparatus according to claim 1,
Wherein each of the first information fuse and the second information fuse is to write and retain inherent information items such as setting values at a time when the product of a semiconductor integrated circuit is shipped, and
Wherein each of the first opening current creation fuse and the second opening current creation fuse is to prohibit the operation of the fuse opening current creation circuit in order to prevent the first information fuse and the second information fuse from being erroneously opened after the product of a semiconductor integrated circuit is shipped.

3. The one-time memory control apparatus according to claim 1, wherein the one-time memory control apparatus is mounted in a vehicle power generator control apparatus.

4. The one-time memory control apparatus according to claim 2, wherein the one-time memory control apparatus is mounted in a vehicle power generator control apparatus.

* * * * *